(12) United States Patent
Zihir et al.

(10) Patent No.: US 10,686,258 B2
(45) Date of Patent: Jun. 16, 2020

(54) HARD-WIRED ADDRESS FOR PHASED ARRAY ANTENNA PANELS

(71) Applicant: Integrated Device Technology, Inc., San Jose, CA (US)

(72) Inventors: Samet Zihir, San Diego, CA (US); Tumay Kanar, San Diego, CA (US); Naveen Krishna Yanduru, San Diego, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 11 days.

(21) Appl. No.: 16/121,891

(22) Filed: Sep. 5, 2018

(65) Prior Publication Data

US 2019/0089067 A1 Mar. 21, 2019

Related U.S. Application Data

(60) Provisional application No. 62/575,346, filed on Oct. 20, 2017, provisional application No. 62/559,875, (Continued)

(51) Int. Cl.
*H01Q 21/00* (2006.01)
*H01Q 21/22* (2006.01)
(Continued)

(52) U.S. Cl.
CPC .............. *H01Q 21/22* (2013.01); *H01Q 1/26* (2013.01); *H01Q 3/28* (2013.01); *H01Q 3/36* (2013.01);
(Continued)

(58) Field of Classification Search
CPC .......... H01Q 1/26; H01Q 1/2283; H01Q 1/38; H01Q 1/48; H01Q 1/523; H01Q 1/526; H01Q 21/00; H01Q 21/0025; H01Q 21/062; H01Q 21/065; H01Q 21/067; H01Q 21/205; H01Q 21/22; H01Q 21/24; H01Q 3/28; H01Q 3/36; H01Q 3/46; H01Q 19/30; H03F 1/0211; H03F 2200/09;
(Continued)

(56) References Cited

U.S. PATENT DOCUMENTS

3,295,134 A * 12/1966 Lowe ....................... H01Q 3/40
                                                                  342/368
4,626,858 A * 12/1986 Copeland ............. H01Q 25/002
                                                                  342/363
(Continued)

*Primary Examiner* — Tho G Phan
(74) *Attorney, Agent, or Firm* — Christopher P. Maiorana, PC (57) ABSTRACT

An apparatus includes a phased array antenna panel and a plurality of beam former circuits. The phased array antenna panel generally comprises a plurality of antenna elements. The plurality of beam former circuits are each mounted on the phased array antenna panel adjacent to a number of the antenna elements. Each beam former circuit has one or more ports directly coupled to each of the adjacent antenna elements. Each beam former circuit may be configured to generate a plurality of radio-frequency output signals at the ports while in a transmit mode and receive a plurality of radio-frequency input signals at the ports while in a receive mode. Each beam former circuit generally implements a hard-wired address.

20 Claims, 10 Drawing Sheets

Related U.S. Application Data filed on Sep. 18, 2017, provisional application No. 62/560,173, filed on Sep. 18, 2017.

(51) Int. Cl.

| | | |
|---|---|---|
| *H01Q 21/24* | (2006.01) | |
| *H01Q 3/28* | (2006.01) | |
| *H03F 3/45* | (2006.01) | |
| *H04B 7/06* | (2006.01) | |
| *H01Q 21/06* | (2006.01) | |
| *H01Q 3/40* | (2006.01) | |
| *H03F 3/195* | (2006.01) | |
| *H03F 3/24* | (2006.01) | |
| *H04B 1/401* | (2015.01) | |
| *H01Q 3/36* | (2006.01) | |
| *H04B 1/44* | (2006.01) | |
| *H01Q 1/26* | (2006.01) | |
| *H01Q 3/46* | (2006.01) | |
| *H01Q 21/20* | (2006.01) | |

(52) U.S. Cl.
CPC .............. *H01Q 3/40* (2013.01); *H01Q 3/46* (2013.01); *H01Q 21/0025* (2013.01); *H01Q 21/065* (2013.01); *H01Q 21/067* (2013.01); *H01Q 21/205* (2013.01); *H01Q 21/24* (2013.01); *H03F 3/195* (2013.01); *H03F 3/245* (2013.01); *H03F 3/4508* (2013.01); *H03F 3/45085* (2013.01); *H04B 1/401* (2013.01); *H04B 1/44* (2013.01); *H04B 7/0617* (2013.01); *H04B 7/0682* (2013.01); *H04B 7/0691* (2013.01); *H03F 2200/09* (2013.01); *H03F 2200/129* (2013.01); *H03F 2200/144* (2013.01); *H03F 2200/27* (2013.01); *H03F 2200/387* (2013.01); *H03F 2200/451* (2013.01); *H03F 2203/45116* (2013.01); *H03F 2203/45151* (2013.01); *H03F 2203/45302* (2013.01); *H03F 2203/45394* (2013.01); *H03F 2203/45512* (2013.01); *H03F 2203/45526* (2013.01); *H03F 2203/45528* (2013.01)

(58) Field of Classification Search
CPC ......... H03F 2200/129; H03F 2200/144; H03F 2200/27; H03F 2200/387; H03F 2200/451; H03F 2203/45116; H03F 2203/45151; H03F 2203/45302; H03F 2203/45394; H03F 2203/45512; H03F 2203/45526; H03F 2203/45528; H03F 3/195; H03F 3/245; H03F 3/4508; H03F 3/45085; H04B 1/401; H04B 1/44; H04B 7/0617; H04B 7/0682; H04B 7/0691
See application file for complete search history.

(56) References Cited

U.S. PATENT DOCUMENTS

| | | | | |
|---|---|---|---|---|
| 5,532,706 A | * | 7/1996 | Reinhardt | H01Q 13/0258 333/21 A |
| 6,680,698 B2 | * | 1/2004 | Eiges | H01Q 1/28 342/361 |
| 7,538,740 B2 | * | 5/2009 | Korisch | H01Q 1/246 343/844 |
| 8,098,198 B2 | * | 1/2012 | Thiesen | H01Q 21/065 342/372 |
| 2006/0284783 A1 | * | 12/2006 | Mohamadi | H01P 1/184 343/853 |

* cited by examiner

HARD-WIRED ADDRESS FOR PHASED ARRAY ANTENNA PANELS

This application relates to U.S. Provisional Application No. 62/559,875, filed Sep. 18, 2017, U.S. Provisional Application No. 62/560,173, filed Sep. 18, 2017, and U.S. Provisional Application No. 62/575,346, filed Sep. 20, 2017, which are hereby incorporated by reference in their entirety.

FIELD OF THE INVENTION

The invention relates to microwave and millimeter-wave circuit design generally and, more particularly, to a method and/or apparatus for implementing a hard-wired address for phased array antenna panels.

BACKGROUND

Phased array antenna panels are used to generate steerable beams that may be utilized in wireless communication systems. Phased arrays create a focused beam that can be steered very quickly to maintain a link for any on-the-move communication system. Conventional wireless communications systems can also utilize steerable beams to communicate with multiple wireless nodes by moving the beams from one wireless node to the next. A single beam may service multiple wireless nodes in a sequence and repeat the sequence periodically such that each wireless node appears to be in constant communications with the system. The beam steering is generally implemented by sending new settings to be loaded into appropriate circuitry of the phased array panels to adjust the beam(s). It is important to ensure that the new settings are loaded into the appropriate circuitry of the appropriate phased array panel to maintain a specified quality of service.

To control phase and gain of multiple antenna elements, digital communication protocols—such as serial peripheral interface (SPI), inter-integrated circuit communications (I²C), Serial Interface, etc.—are used where multiple elements (chips) are all connected to the same digital buses. To communicate with the multiple chips, conventional systems use a one-at-a-time timing scheme to configure the multiple units. In order to select which unit (chip) is active in conventional systems, each chip has a unique (dedicated) Chip Select (CS) pin. Because multiple chips require connections to multiple CS pins, conventional systems require complex boards and panel area.

It would be desirable to implement a hard-wired address for phased array antenna panels.

SUMMARY

The invention concerns an apparatus including a phased array antenna panel and a plurality of beam former circuits. The phased array antenna panel generally comprises a plurality of antenna elements. The plurality of beam former circuits are each mounted on the phased array antenna panel adjacent to a number of the antenna elements. Each beam former circuit has one or more ports directly coupled to each of the adjacent antenna elements. Each beam former circuit may be configured to generate a plurality of radio-frequency output signals at the ports while in a transmit mode and receive a plurality of radio-frequency input signals at the ports while in a receive mode. Each beam former circuit generally implements a hard-wired address.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a hard-wired address for phased array antenna panels that may (i) allow multiple phased array antenna panels to be coupled by a single serial link (or bus), (ii) allow a controller to uniquely address individual phased array antenna panels, (iii) set an external address for one or more circuits on a phased array antenna panel, (iv) be compliant with a number of serial protocols or interface standards (e.g., SPI, I²C, etc.), and/or (v) be implemented as one or more integrated circuits.

Figure 1:
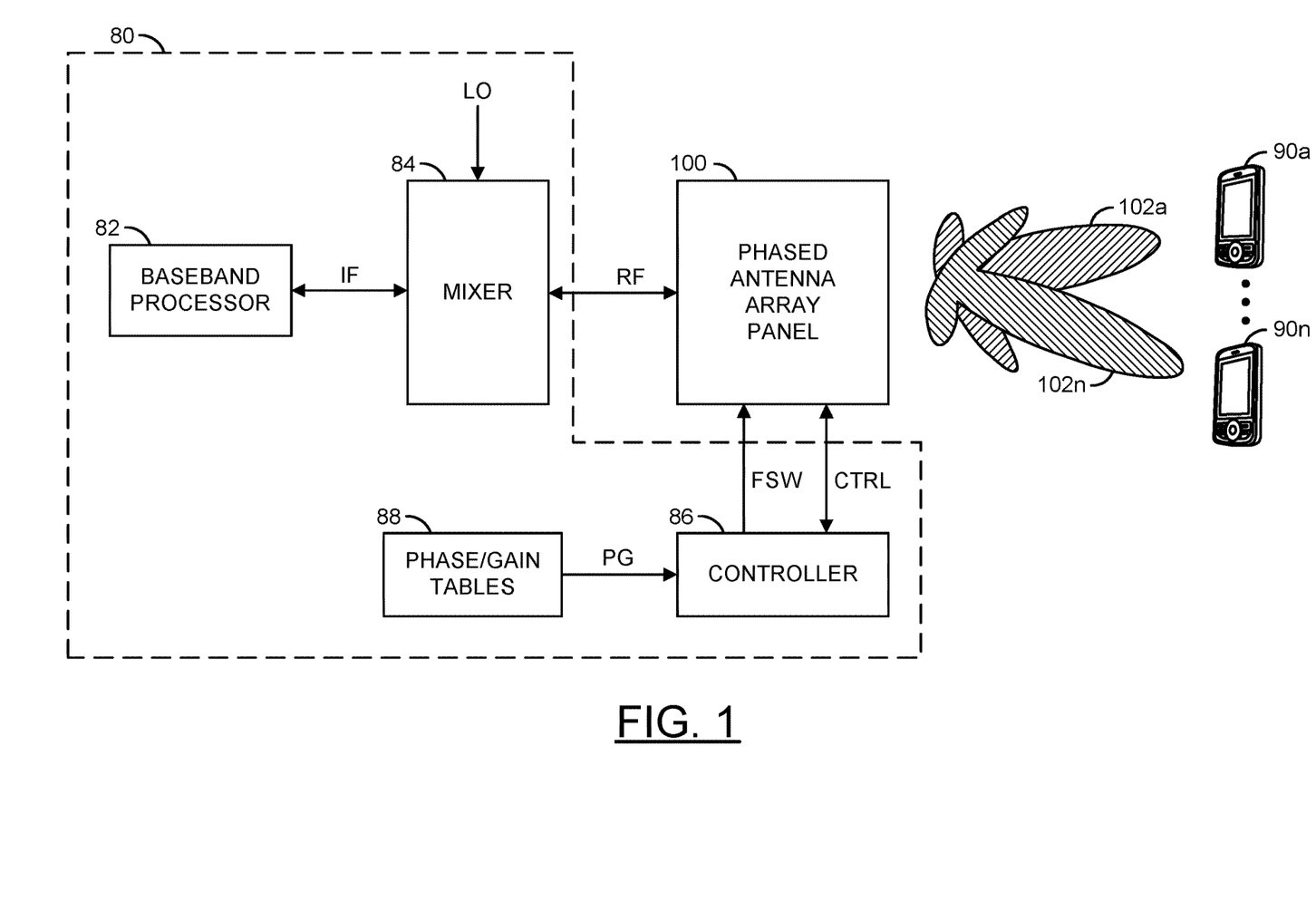
FIG. 1 is a diagram of a system illustrating an example context of the invention.

Referring to FIG. 1, a block diagram of a system 80 is shown illustrating an example context of the invention. The system (or module or circuit or apparatus) 80 may implement a radio-frequency (RF) transceiver system in accordance with an example embodiment of the invention. The RF transceiver system 80 may be configured to operate at common wireless radio frequencies, millimeter-wave frequencies, and/or microwave frequencies. In an example, the RF transceiver system 80 may be configured to facilitate communication with and/or between a plurality of communications devices (or terminals) 90a-90n. In an example, the communications devices 90a-90n may include, but are not limited to, cellular telephones, mobile devices, tablets, internet-of-things (IoT) equipment, etc. In various embodiments, the RF transceiver system 80 and the communications devices 90a-90n may be coupled using at least one phased array antenna panel 100 in accordance with an example embodiment of the invention.

In an example, the RF transceiver system 80 may form part of a communications link. In some embodiments, the communications link may be part of a fifth generation (5G) wireless communications system (e.g., for which a standard is currently under development by the Next Generation Mobile Networks (NGMN) Alliance). In other embodiments, the communications link may be part of systems including, but not limited to, a fourth generation (4G) wireless communications system (e.g., International Mobile Telecommunications-Advanced (IMT-A) standard published by the International Telecommunications Unit Radiocommunication Sector (ITU-R)), a satellite communication (SATCOM) system, and point-to-point communications systems such as common data link (CDL). However, other communications standards may be implemented to meet the design criteria of a particular application.

In an example, the RF transceiver system 80 may comprise a block (or circuit) 82, a block (or circuit) 84, a block (or circuit) 86, and a block (or circuit) 88. In various embodiments, the blocks 82-88 may be implemented with hardware, a combination of hardware and software, and/or simulated with software. A signal (e.g., IF) may be exchanged between the circuit 82 and the circuit 84. The signal IF may implement an intermediate-frequency signal. In an example, the signal IF may be configured (e.g., using various modulation schemes) to carry information to be transmitted from and/or received by the RF transceiver system 80. In an example, a signal (e.g., LO) may be presented to the circuit 84. The signal LO may implement a local oscillator signal. A signal (e.g., RF) may be exchanged between the circuit 84 and the phased array antenna panel 100. The signal RF may be a radio-frequency, millimeter-wave frequency, or microwave frequency signal that conveys the information also found in the intermediate-frequency signal IF.

In a transmit mode, the radio-frequency signal RF may convey information to be broadcast from the phased array antenna panel 100 to the devices 90a-90n. In a receive mode, the radio-frequency signal RF may convey information received from the devices 90a-90n via the phased array antenna panel 100. A signal (e.g., FSW) and a signal or signals (e.g., CTRL) may be exchanged between the circuit 86 and the phased array antenna panel 100. The signal FSW may switch the phased array antenna panel 100 between the transmit mode and the receive mode. The signal(s) CTRL may convey data, clocking, and control elements. In an example, the signals FSW and CTRL may be part of a digital interface of the phased array antenna panel 100. In an example, the signal(s) CTRL may be implemented as a serial link that conveys information for configuring and/or determining phase and gain settings for antenna elements of the phased array antenna panel 100. In an example, the signal(s) CTRL may be compliant with one or more serial communication protocols or interfaces (e.g., serial peripheral interface (SPI), inter-integrated circuit communications ($I^2C$), daisy chain, etc.). A signal or signals (e.g., PG) may be transferred from the circuit 88 to the circuit 86. In an example, the signal(s) PG may convey phase information and gain information used by the circuit 86 to implement (control) beam steering using the phased array antenna panel 100. In an example, the signal(s) PG may convey a plurality of phase and gain valves that may be programmed into a plurality of beam former circuits of the phased array antenna panel 100 via the signal(s) CTRL.

The phased array antenna panel 100 generally implements a hard-wired address scheme in accordance with an example embodiment of the invention. The hard-wired address scheme may be used to uniquely identify serial communications intended for elements (e.g., the beam former circuits) of the phased array antenna panel 100. In various embodiments, multiple phased array antenna panels 100 may be combined to form a larger antenna array that may provide more transmission channels. The multiple phased array antenna panels may share a serial communication channel, link, or bus. Each of the phased array antenna panels 100 making up the larger antenna array may be uniquely addressed using respective hard-wired addresses.

The phased array antenna panel 100 may generate one or more fields (or beams) 102a-102n. The fields 102a-102n may represent a field pattern (or radio-frequency beam pattern) created by the beam former circuits of the phased array antenna panel 100 based upon the phase and gain information (values) received via the signal(s) CTRL. The phased array antenna panel 100 may be configured to produce directional beams 102a-102n for communication with the communication devices 90a-90n. In an example, the phased array antenna panel 100 may be controlled to steer the beams 102a-102n, based on the phase and gain information received via the signal(s) CTRL, to track movement of the communication devices 90a-90n and/or switch between the communication devices 90a-90n.

The circuit 82 may implement a baseband processor circuit. The circuit 82 may be operational to process the information sent by and/or received in the intermediate-frequency signal IF. The circuit 82 may process the information within the RF transceiver system 80. The processing may include, but is not limited to, modulation/demodulation of the signal that contains the information and management of simultaneous communications between the RF transceiver system 80 and the multiple remote terminals 90a-90n.

The circuit 84 may implement one or more mixer circuits. The circuit 84 is generally operational to frequency convert (e.g., up-convert, down-convert, etc.) between an intermediate frequency used for the signal IF and the radio frequency, millimeter-wave frequency, or microwave frequency used for the signal RF. The frequency conversion may be based on one or more local oscillator frequencies provided by the signal LO. In various embodiments, the radio-frequency signal RF may be in a range of frequencies approximately centered around a center frequency of either 28 gigahertz (GHz) or 39 GHz (e.g., 24 GHz to 30 GHz or 37 GHz to 44 GHz). In embodiments implementing multiple intermediate frequencies, each intermediate frequency may cover a band from approximately 2 GHz to about 6 GHz (e.g., an approximately 4 GHz bandwidth). In an example, each local oscillator frequency may range from approximately 22 GHz to 26 GHz when the signal RF is approximately centered at 28 GHz. In another example, each local oscillator frequency may range from approximately 33 GHz to 37 GHz when the signal RF is approximately centered at 39 GHz. However, other frequency ranges may be implemented to meet the design criteria of a particular application.

The circuit 86 may implement a control circuit. In various embodiments, the circuit 86 may be implemented using one or more of an application specific integrated circuit (ASIC), controller, microprocessor, or circuitry configured accordingly. The circuit 86 is generally operational to control the operations of the phased array antenna panel 100. In some embodiments, the circuit 86 may determine the setting values used in each transceiver channel within the beam former circuits of the phased array antenna panel 100. The setting values may establish the geometry of the field(s) or beam(s) 102a-102n. In various embodiments, the circuit 86 may be implemented as one or more integrated circuits.

In an example, the circuit 88 may implement a table of values (e.g., embodied in a memory circuit). In an example, the table of values embodied in the circuit 88 may be configured to store multiple gain (G) values and multiple phase (P) values. The phase and gain values may be used by the transceiver channels in the phased array antenna panel 100 to establish the fields 102a-102b. The phase values and the gain values may be fetched from the circuit 88 via the signal PG and programmed into buffers associated with the beam formers of the phased array antenna panel 100 by the circuit 86. In various embodiments, the circuits 86 and 88 may be implemented either on the same integrated circuit or on different (separate) integrated circuits.

In an example, the phased array antenna panel 100 may be implemented comprising either single-polarization (or single-pole) antenna elements or dual-polarization (or dual-pole or di-pole) antenna elements. The phased array antenna panel 100 may be operational to transmit and receive wireless signals to and from the devices (or terminals) 90a-90n. The devices (or terminals) 90a-90n may be remotely located from the RF transceiver system 80. Sensitivity to the wireless signals may be determined by the fields 102a-102n created by the phased array antenna panel 100. The phased array antenna panel 100 may comprise a plurality of antenna elements and a plurality of beam former circuits. Each beam former circuit may implement a plurality of transceiver channels. Each transceiver channel generally comprises a transmit channel and a receive channel. The transceiver channels may be coupled to the antenna elements by corresponding bidirectional radio-frequency signals. The transceiver channels and antenna elements generally form a two-dimensional antenna network.

Figure 2:
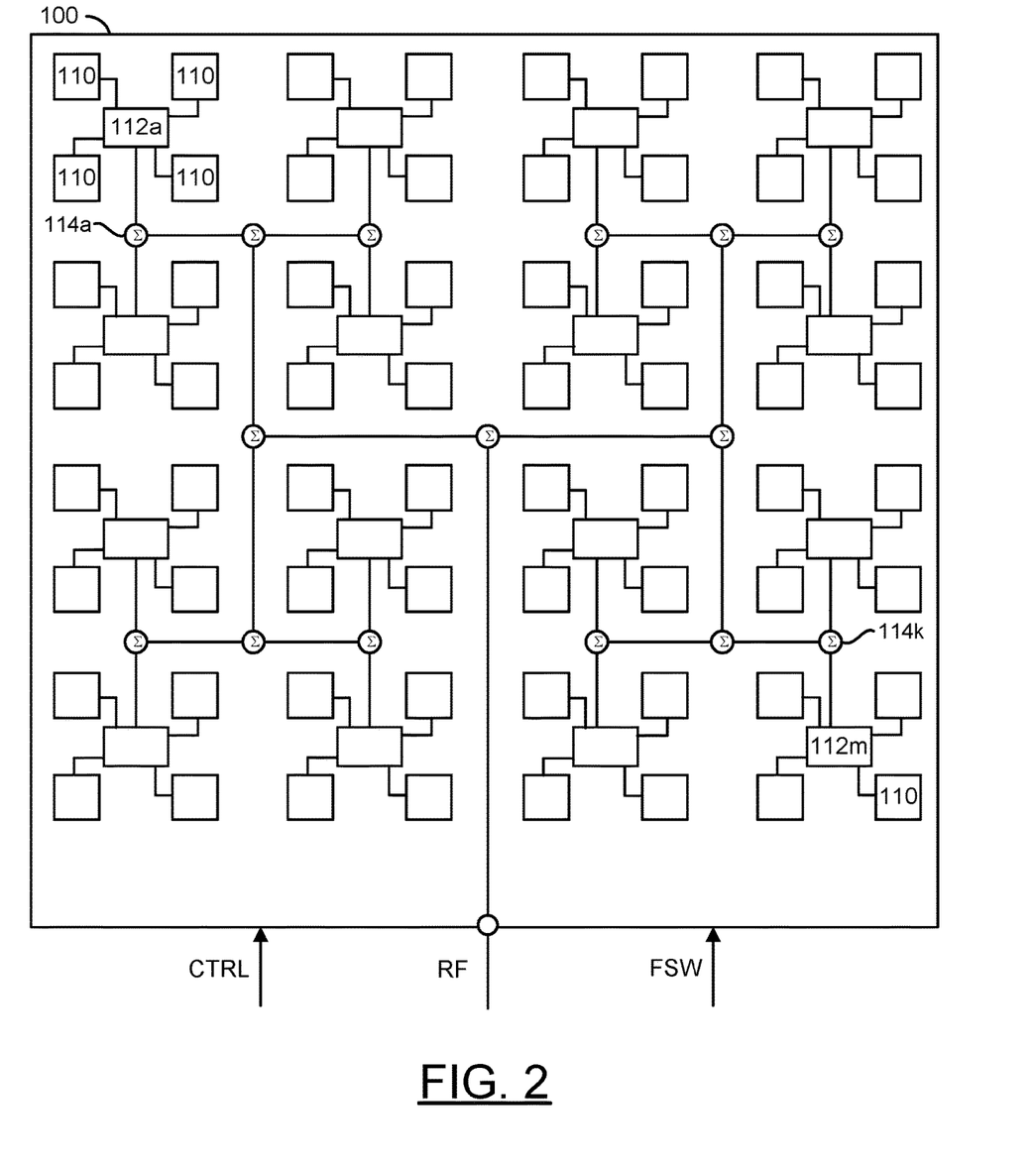
FIG. 2 is a diagram illustrating an example implementation of a single-polarization phased array antenna panel in accordance with an example embodiment of the invention.

Referring to FIG. 2, a diagram is shown illustrating an example implementation of a single-polarization version of the phased array antenna panel 100 in accordance with an embodiment of the invention. In an example, the phased array antenna panel 100 may comprise a number of blocks (or circuits) 110, a number of blocks (or circuits) 112a-112m, and a number of blocks (or circuits) 114a-114k. In embodiments implementing a single-polarization phased array antenna panel, the blocks 110 generally are implemented as single polarization (or single-pole) antenna elements. Each of the circuits 112a-112m may implement a single-polarization beam former circuit. Each of the circuits 114a-114k may implement a combiner/splitter circuit. The circuits 112a-112m, and 114a-114k may be implemented with hardware, a combination of hardware and software, and/or simulated with software. In an example, the signal RF may be exchanged with one of the circuits 114a-114k. The signal(s) CTRL may be exchanged with the circuits 112a-112m.

The antenna elements 110 in the phased array antenna panel 100 may be used for both transmission and reception. A physical positioning of the antenna elements 110 generally provides for two-dimensional (e.g., horizontal and vertical) control of the fields 102a-102n. In an example, the antenna elements 110 may be arranged in a 2-dimensional (e.g., N×N) grid pattern, where N is an integer value divisible by 2. However, other dimensions of grid patterns may be implemented accordingly to meet design criteria of a particular implementation.

The circuits 112a-112m are generally operational to multiplex/demultiplex the signal RF with a number of the antenna elements 110. In various embodiments, each of the circuits 112a-112m may be mounted on a substrate of the phased array antenna panel 100 adjacent to (e.g., centered among) a number of the antenna elements 110. In an example, each circuit 112a-112m generally comprises a number of transceiver channels that are coupled to respective antenna elements 110. In an example, each circuit 112a-112m may be coupled to four adjacent antenna elements 110 (e.g., arranged in a 2×2 grid around each circuit 112a-112m). The circuits 112a-112m may be configured to switch between a transmit mode and a receive mode in response to the signal FSW. In the transmit mode, the circuits 112a-112m may be operational to rapidly change setting values (e.g., phase values, gain values, etc.) used by the transceiver channels in order to steer the fields 102a-102n formed by the phased array antenna panel 100. In various embodiments, each of the circuits 112a-112m may be implemented as one or more integrated circuits (e.g., in a package or multi-chip module (MCM)).

In various embodiments, each of the circuits 114a-114k may be implemented as a combiner/splitter circuit. In an example, the circuits 114a-114k may be implemented as Wilkinson combiner/splitters. In various embodiments, the circuits 114a-114k may be coupled together to form a network that couples the circuits 112a-112m to an input/output of the phased array antenna panel 100 configured to present/receive the signal RF. In the transmit mode, the circuits 114a-114k are generally operational to distribute the power in the signal RF among the circuits 112a-112m. In the receive mode, the circuits 114a-114k may be operational to combine the power received in signals from the circuits 112a-112m into the signal RF. The circuits 112a-112n and 114a-114k are generally configured to provide a substantially equivalent path length between the RF input/output of the phased array antenna panel 100 and each of the circuits 112a-112m.

Figure 3:
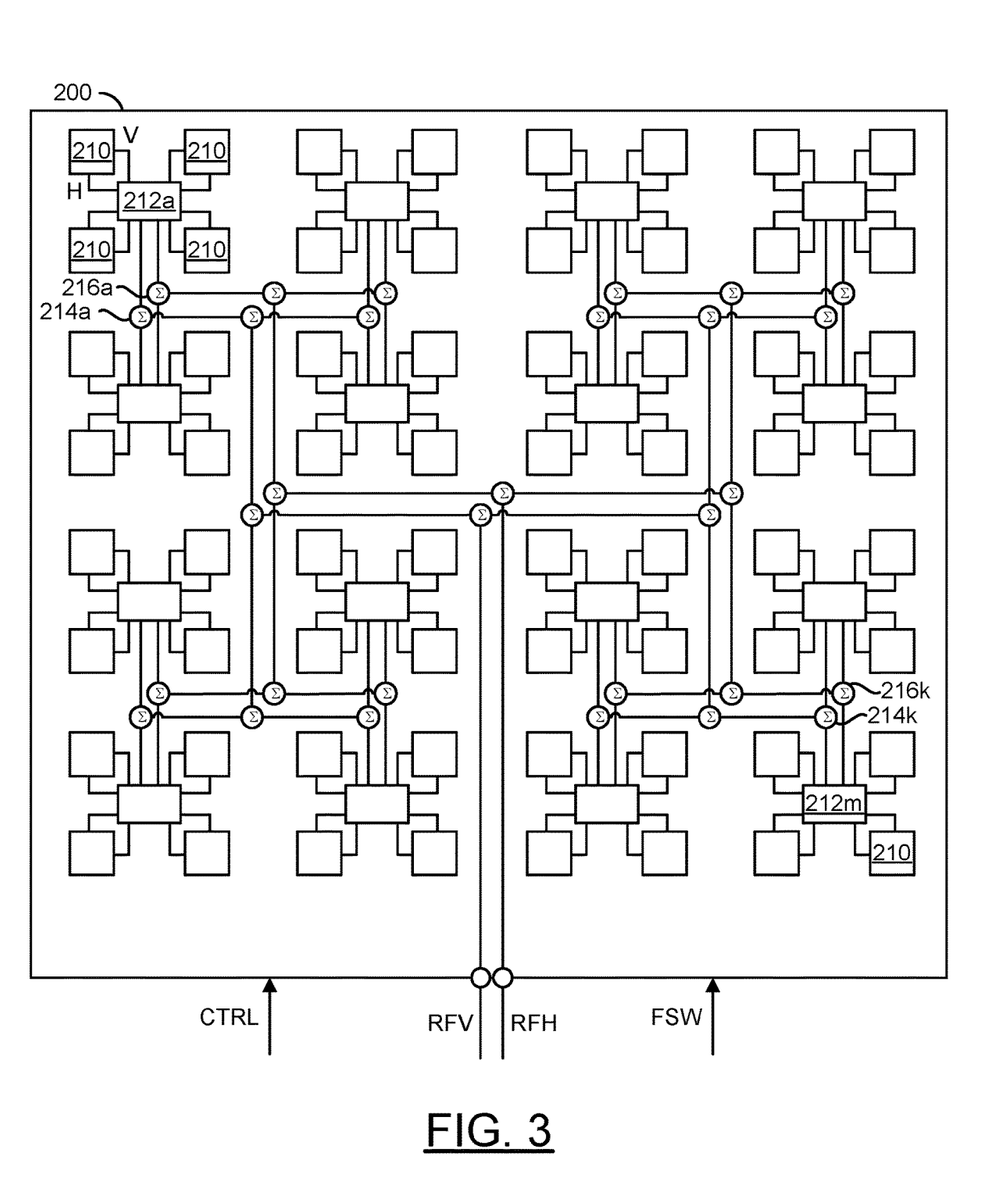
FIG. 3 is a diagram illustrating a dual-polarization phased array antenna panel in accordance with an example embodiment of the invention.

Referring to FIG. 3, a diagram of phased array antenna panel 200 is shown illustrating an example implementation of a dual-polarization phased array antenna panel in accordance with another example embodiment of the invention. In embodiments implementing dual-polarization transceiver channels, the phased array antenna panel 200 may be used in place of the phased array antenna panel 100 of FIG. 1. In an example, the phased array antenna panel 200 may comprise a number of blocks (or circuits) 210, a number of blocks (or circuits) 212a-212m, a number of blocks (or circuits) 214a-214k, and a number of blocks (or circuits) 216a-216k. In embodiments implementing a dual-polarization phased array antenna panel, the blocks 210 generally are implemented as dual-polarization (or dual-pole or di-pole) antenna elements. Each of the circuits 212a-212m may implement a dual-polarization beam former circuit. Each of the circuits 214a-214k and 216a-216k may implement a combiner/splitter circuit. The circuits 212a-212m, 214a-214k, and 216a-216k may be implemented with hardware, a combination of hardware and software, and/or simulated with software. In embodiments implementing the dual-polarization phased array antenna panel 200, the signal RF may comprise a vertical polarized component (e.g., RFV) and a horizontal polarized component (e.g., RFH). In an example, the signal RFV may be exchanged with one of the circuits 214a-214k and the signal RFH may be exchanged with one of the circuits 216a-216k. The signal(s) CTRL may be exchanged with the circuits 212a-212m.

The antenna elements 210 in the phased array antenna panel 200 may be used for both transmission and reception. A physical positioning of the antenna elements 210 generally provides for two-dimensional (e.g., horizontal and vertical) control of the fields 102a-102n. In an example, the antenna elements 210 may be arranged in a 2-dimensional (e.g., N×N) grid pattern, where N is an integer value divisible by 2. However, other dimensions of grid patterns may be implemented accordingly to meet design criteria of a particular implementation.

The circuits 212a-212m are generally operational to multiplex/demultiplex the signals RFV and RFH with a number of the antenna elements 210. In various embodiments, each of the circuits 212a-212m may be mounted on a substrate of the phased array antenna panel 200 adjacent to a number of the antenna elements 210. Each of the circuits 212a-212m may have respective horizontal (H) and vertical (V) input/outputs that may be coupled to corresponding horizontal (H) and vertical (V) input/outputs of the adjacent antenna elements 210. In an example, each circuit 212a-212m generally comprises a number of transceiver channels that are coupled to respective horizontal and vertical input/outputs. In an example, each circuit 212a-212m may be coupled to four adjacent antenna elements 210 (e.g., arranged in a 2×2 grid around each circuit 212a-212m). The circuits 212a-212m may be configured to switch between a transmit mode and a receive mode in response to the signal FSW. In the transmit mode, the circuits 212a-212m may be operational to rapidly change setting values (e.g., phase values, gain values, etc.) used by the transceiver channels in order to steer the fields 102a-102n formed by the phased array antenna panel 200. In various embodiments, each of the circuits 212a-212m may be implemented as one or more integrated circuits (e.g., in a package or multi-chip module (MCM)). In an example, each of the circuits 212a-212m may be mounted on a substrate of the phased array antenna panel 200 adjacent to (e.g., centered among) the respective antenna elements 210.

In various embodiments, each of the circuits 214a-214k and 216a-216k may implement a combiner/splitter circuit. In an example, each of the circuits 214a-214k and 216a-216k may be implemented as a Wilkinson combiner/splitter circuit. The circuits 214a-214k may be coupled together to form a network that couples the circuit 212a-212m to an input/output of the phased array antenna panel 200 configured to present/receive the signal RFV. The circuits 216a-216k may be coupled together to form a network that couples the circuit 212a-212m to an input/output of the phased array antenna panel 200 configured to present/receive the signal RFH. In the transmit mode, the circuits 214a-214k and 216a-216k are generally operational to distribute the power in the signals RFV and RFH, respectively, among the circuits 212a-212m. In the receive mode, the circuits 214a-214k and 216a-216k may be operational to combine the power received in signals from the circuits 212a-212m, respectively, into the signals RFV and RFH. The circuits 212a-212n, 214a-214k, and 216a-216k are generally configured to provide a substantially equivalent path length between the RFV input/output and the RFH input/output of the phased array antenna panel 200 and each of the circuits 212a-212m.

Figure 4:
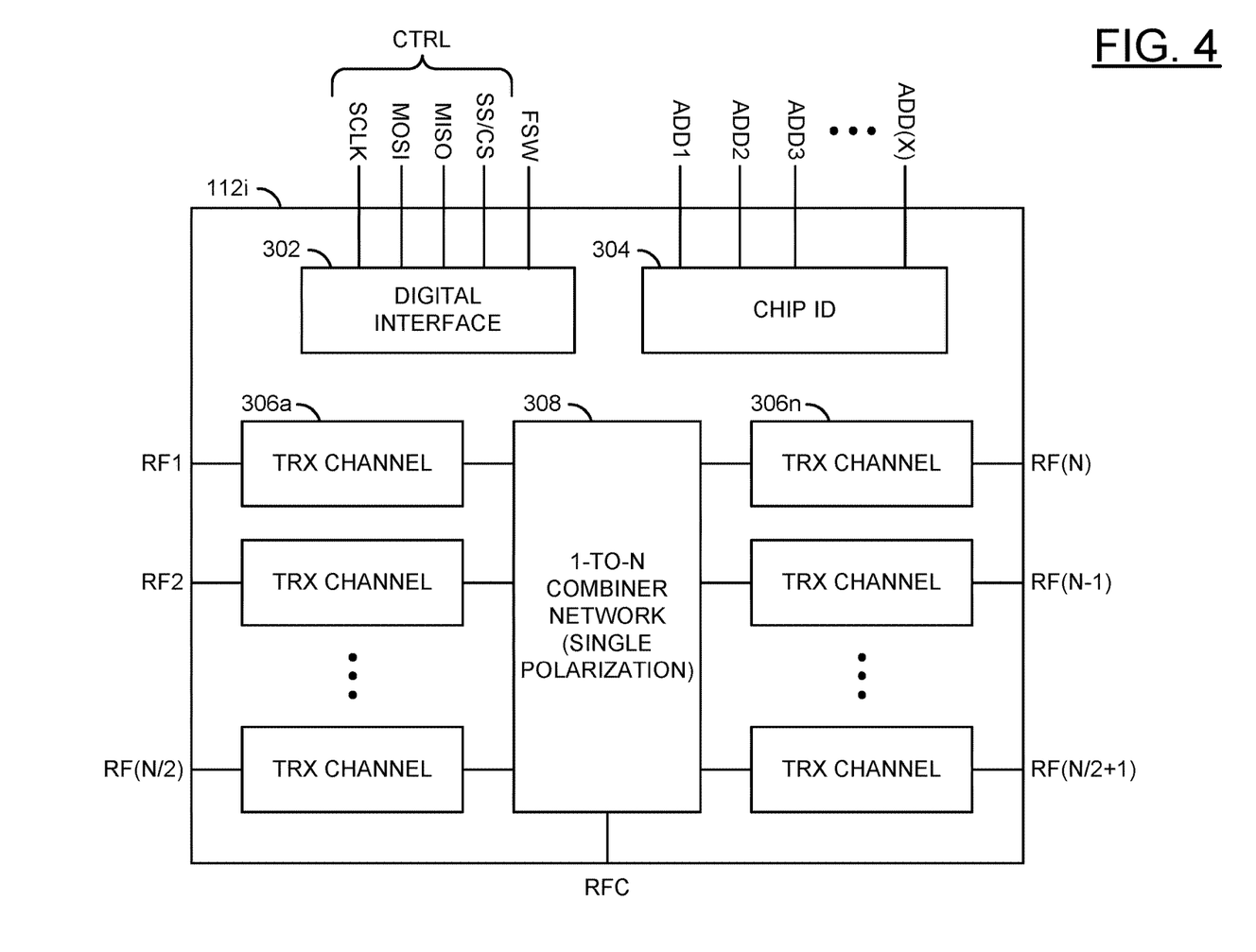
FIG. 4 is a diagram of a single-polarization beam former circuit in accordance with an example embodiment of the invention.

Referring to FIG. 4, a diagram is shown illustrating an example implementation of a single-polarization beam former circuit 112i in accordance with an example embodiment of the invention. In an example, the single-polarization beam former circuit 112i may be representative of the single-polarization beam former circuits 112a-112m of FIG. 2. In an example, the single-polarization beam former circuit 112i may have a digital interface configured to receive the signal FSW and the signal(s) CTRL, a common RF input/output port (RFC), and a number of antenna input/output ports (RF1-RFN). In general, any number (e.g., N) of antenna input/output ports (or channels) may be implemented accordingly to meet design criteria of a particular implementation.

In various embodiments, the signal RF may be presented/received by the common RF input/output RFC, and the antenna input/output ports RF1-RFN may be coupled to respective antenna elements 110. The single-polarization beam former circuit 112i generally implements a number of transceiver channels corresponding to the number of antenna input/output ports RF1-RFN. In various embodiments, each of the transceiver channels may comprise a respective transmit channel and a respective receive channel. The transceiver channels are generally configured to switch between transmitting or receiving based upon the signal FSW.

The single-polarization beam former circuit 112i generally implements a transmit mode and a receive mode. In an example, a state of the signal FSW may determine whether the transmit mode or the receive mode is active. In the transmit mode, the single-polarization beam former circuit 112i is generally configured to receive the radio frequency signal RF at the common input/output port RFC and present radio frequency signals at the antenna input/output ports RF1-RFN. The signals presented at each of the antenna input/output ports RF1-RFN are generated by the single-polarization beam former circuit 112i in response to the radio frequency signal RF received at the common input/output port RFC and a respective number of setting values (e.g., gain, phase, etc.) for each transceiver channel corresponding to each of the antenna input/output ports RF1-RFN. In the receive mode, the single-polarization beam former circuit 112i is generally configured to combine radio frequency signals received at the antenna input/output ports RF1-RFN for presentation as the signal RF at the common input/output port RFC.

The single-polarization beam former circuit 112i may comprise a block (or circuit) 302, a block (or circuit) 304, a number of blocks (or circuits) 306a-306n, and a block (or circuit) 308. The circuit 302 may implement an interface circuit. In various embodiments, the circuit 302 may implement a digital interface. The circuit 304 may implement a hard-wired address (e.g., chip ID) for the beam former circuit 112i. The circuits 306a-306n may implement transceiver (TRX) channels. The circuit 308 may implement a 1-to-N combiner/splitter network.

In an example, the signals FSW and CTRL are exchanged with the circuit 302. In an example, the circuit 302 may comprise a serial interface. The circuit 302 may be configured to be compliant with one or more serial interface standards including, but not limited to, serial peripheral interface (SPI), inter-integrated circuit (I²C), daisy chain, etc. In an example, the circuit 302 may be configured to allow programming and control of the single-polarization beam former circuit 112i using a serial communication link (or bus). In an example, the circuit 302 may be configured to program and control the circuits 306a-306n in response to the signals CTRL and FSW. In an example, the circuit 302 may control whether the circuits 306a-306n operate in a transmit mode or a receive mode in response to the signal FSW.

In an example, the circuit 302 may implement a 4-wire embedded SPI core. In an example, the circuit 302 may have a first pin that may receive a first signal (e.g., MOSI), a second pin that may present a second signal (e.g., MISO), a clock input pin that may receive a clock signal (e.g., SCLK), and a chip enable (or chip select) pin that may receive a signal (e.g., SS/CS). In an example, the signals MOSI, MISO, SCLK, and SS/CS may be components of the signal(s) CTRL. In an example, the circuit 302 may include a transmit/receive function switching pin that may receive the signal FSW. In an example, the signals MOSI, MISO, SCLK, and SS/CS may be configured to implement a 4-wire SPI protocol interface as summarized in the following TABLE 1:

TABLE 1

| SIGNAL | FUNCTION |
| --- | --- |
| MOSI | Master out Slave in |
| MISO | Master in Slave out |
| SCLK | Serial clock |
| SS/CS | Slave Select/Chip Select |

In an example, the circuit 304 may set a physical address of the beam former circuit 112$i$ based upon hardware coded address bits (or pins). In various embodiments, a hard-wired address may be implemented having a number (e.g., X) of input bits (e.g., ADD1, ADD2, . . . , ADD(X)). In an example, the address may be implemented having six bits (or pins). In some embodiments, the hard-wired address may be set to predetermined logic levels (e.g., 0 or 1) by tying a number of address pins to predetermined supply voltages (e.g., GND, VSS, or VDD). In some embodiments, the hard-wired address bits may be hard coded within the chip implementing the beam former 112$i$. In some embodiments, the hard-wired address bits may be programmable within the chip implementing the beam former 112$i$ during manufacturing. In an example, the hard-wired address bits may be programmed using fuses, anti-fuses, or other conventional techniques.

Figure 5:
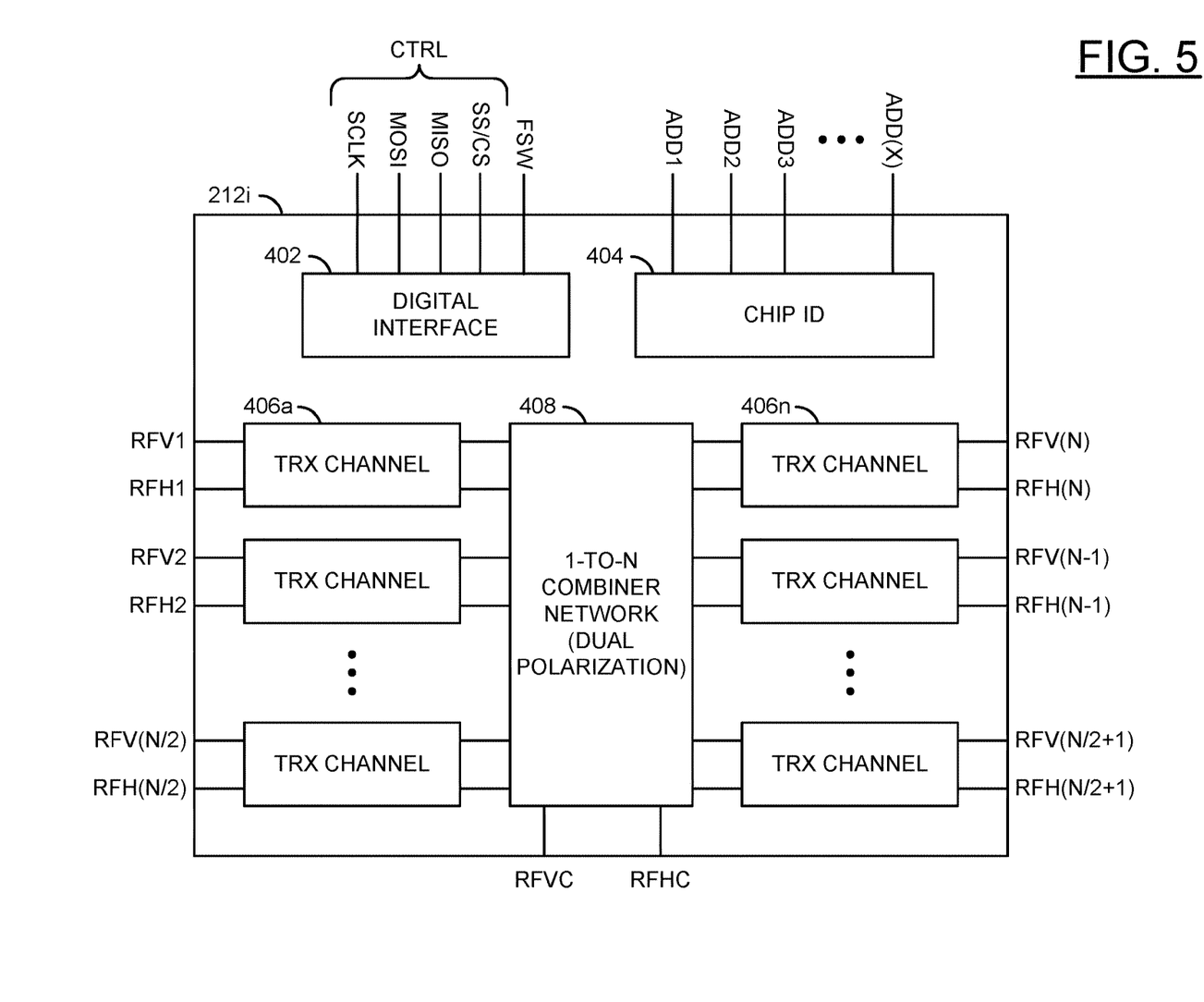
FIG. 5 is a diagram of a dual-polarization beam former circuit in accordance with an example embodiment of the invention.

Referring to FIG. 5, a diagram is shown illustrating an example implementation of a dual-polarization beam former circuit 212$i$ in accordance with an example embodiment of the invention. In an example, the dual-polarization beam former circuit 212$i$ may be representative of the dual-polarization beam former circuits 212$a$-212$m$ of FIG. 3. In an example, the dual-polarization beam former circuit 212$i$ may have a digital interface configured to receive the signal FSW and the signal(s) CTRL, a first common RF input/output port (RFVC), a second common RF input/output port (RFHC), a number of vertical antenna input/output ports (RFV1-RFV(N)), and a number of horizontal antenna input/output port (RFH1-RFH(N)). In general, any number (e.g., N) of vertical and horizontal antenna input/output ports (or channels) may be implemented accordingly to meet design criteria of a particular implementation.

In various embodiments, the signal RFV may be presented/received by the common RF input/output RFVC, the signal RFH may be presented/received by the common RF input/output RFHC, the vertical antenna input/output ports RFV1-RFV(N) may be coupled to corresponding vertical input/outputs of the respective antenna elements 210, and the horizontal antenna input/output ports RFH1-RFH(N) may be coupled to corresponding horizontal input/outputs of the respective antenna elements 210. The dual-polarization beam former circuit 212$i$ generally implements a number (e.g., N) of transceiver channels corresponding to the number of pairs of vertical and horizontal antenna input/output ports (RFV1, RFH1), (RFV2, RFH2), . . . (RFV(N), RFH (N)). In various embodiments, each of the transceiver channels may comprise a respective transmit channel and a respective receive channel. The transceiver channels are generally configured to switch between transmitting or receiving based upon the signal FSW.

The dual-polarization beam former circuit 212$i$ generally implements a transmit mode and a receive mode. In an example, a state of the signal FSW may determine whether the transmit mode or the receive mode is active. In the transmit mode, the dual-polarization beam former circuit 212$i$ is generally configured to receive radio frequency signals at the common input/output ports RFVC and RFHC, and present radio frequency signals at the antenna input/output ports RFV1-RFV(N) and RFH1-RFH(N). The signals presented at each of the antenna input/output ports RFV1-RFV(N) and RFH1-RFH(N) are generated by the dual-polarization beam former circuit 212$i$ in response to the radio frequency signals received at the common input/output ports RFVC and RFHC and a respective number of setting values (e.g., gain, phase, etc.) corresponding to each of the antenna input/output ports RFV1-RFV(N) and RFH1-RFH (N).

In an example, the dual-polarization beam former circuit 212$i$ may comprise a block (or circuit) 402, a block (or circuit) 404, a number of blocks (circuits) 406$a$-406$n$, and a block (or circuit) 408. The circuit 402 may implement an interface circuit. In various embodiments, the circuit 402 may implement a digital interface. The circuit 404 may implement a hard-wired address (e.g., chip ID) for the beam former circuit 212$i$. The circuits 406$a$-406$n$ may implement transceiver (TRX) channels. The circuit 408 may implement a 1-N dual-channel combiner/splitter network.

In an example, the signals FSW and CTRL are exchanged with the circuit 402. In an example, the circuit 402 may comprise a serial interface. The circuit 402 may be configured to be compliant with one or more serial interface standards including, but not limited to, serial peripheral interface (SPI), inter-integrated circuit (I$^2$C), daisy chain, etc. In an example, the circuit 402 may be configured to allow programming and control of the dual-polarization beam former circuit 212$i$ using a serial communication link (or bus). In an example, the circuit 402 may be configured to program and control the circuits 406$a$-406$n$ in response to the signals CTRL and FSW. In an example, the circuit 402 may control whether the circuits 406$a$-406$n$ operate in a transmit mode or a receive mode in response to the signal FSW.

In an example, the circuit 402 may implement a 4-wire embedded SPI core. In an example, the circuit 402 may have a first pin that may receive a first signal (e.g., MOSI), a second pin that may present a second signal (e.g., MISO), a clock input pin that may receive a clock signal (e.g., SCLK), and a chip enable (or chip select) pin that may receive a signal (e.g., SS/CS). In an example, the signals MOSI, MISO, SCLK, and SS/CS may be components of the signal(s) CTRL. In an example, the circuit 402 may include a transmit/receive function switching pin that may receive the signal FSW. In an example, the signals MOSI, MISO, SCLK, and SS/CS may be configured to implement the 4-wire SPI protocol interface as summarized in the TABLE 1 above.

In an example, the circuit 404 may set a physical address of the dual-polarization beam former circuit 212$i$ based upon hardware coded address bits (or pins). In various embodiments, a hard-wired address may be implemented having a number (e.g., X) of input bits (e.g., ADD1, ADD2, . . . , ADD(X)). In an example, the address may be implemented having six bits (or pins). In some embodiments, the hard-wired address may be set to predetermined logic levels (e.g., 0 or 1) by tying a number of address pins to predetermined supply voltages (e.g., GND, VSS, or VDD). In some embodiments, the hard-wired address bits may be hard coded within the chip implementing the beam former 212$i$ during manufacturing. In some embodiments, the hard-wired address bits may be programmed within the chip implementing the beam former 212i. In an example, the hard-wired bits may be programmed using fuses, anti-fuses, or other conventional techniques.

Figure 6:
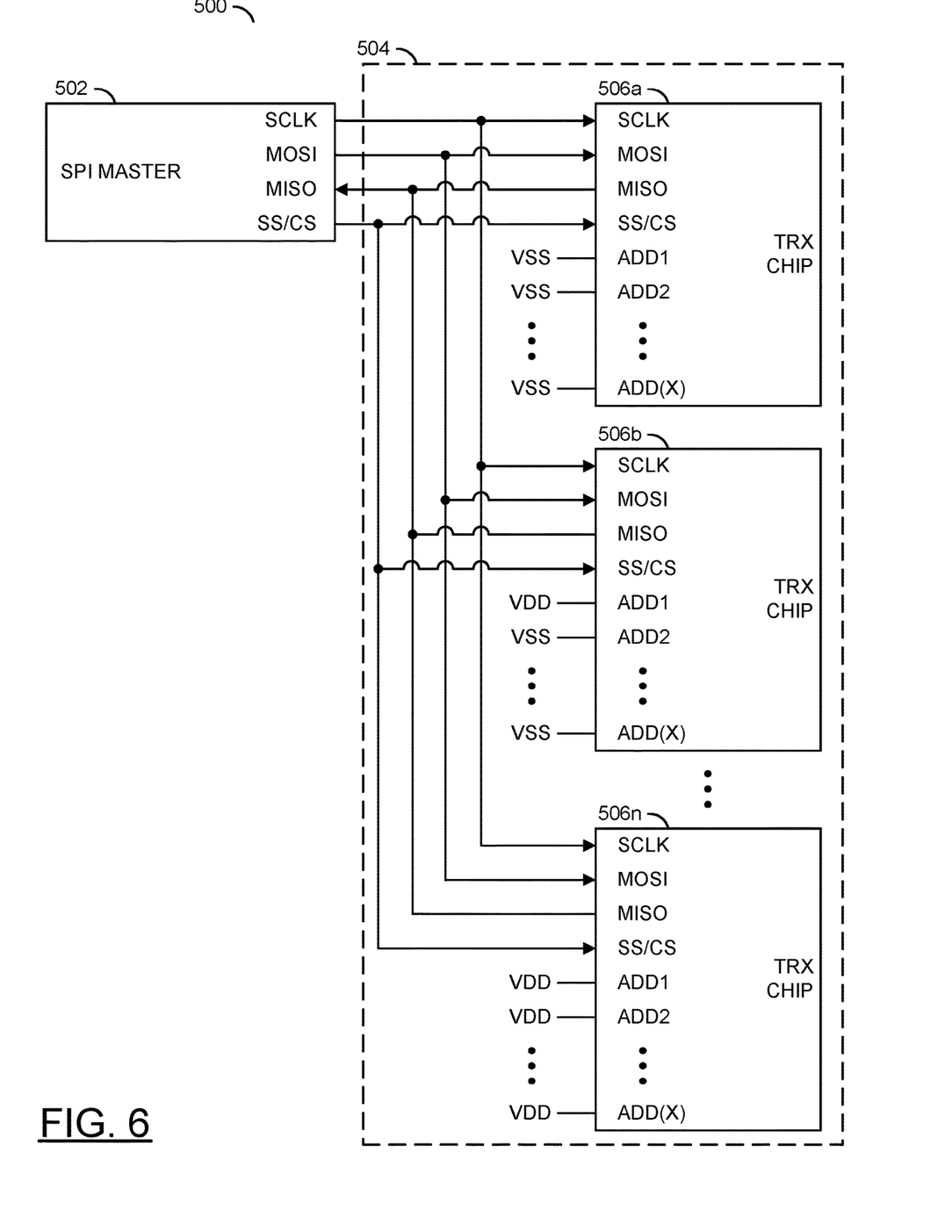
FIG. 6 is a diagram illustrating an example system comprising a serially connected phased array antenna panel.

Referring to FIG. 6, a diagram of a system 500 is shown illustrating a serially connected phased array antenna panel in accordance with an example embodiment of the invention. In an example, the system 500 comprises an SPI Master core 502 and a phased array antenna panel 504. In an example, the SPI Master core 502 may be part of a control circuit similar to the circuit 86 described above in connection with FIG. 1. The phased array antenna panel 504 is illustrated comprising a plurality of transceiver (TRX) chips 506a-506n. The transceiver (TRX) chips 506a-506n may implement beam former circuits similarly to the circuit 112i (described above in connection with FIG. 4) or the circuit 212i (described above in connection with FIG. 5). In an example, the SPI Master 502 is connected to the transceiver (TRX) chips 506a-506n by a serial bus carrying the signals SCLK, MOSI, MISO, and SS/CS. In an example, each of the transceiver (TRX) chips 506a-506n is hard-wired to have a unique address.

In an example, the chip 506a may be hard-wired to an address 001 . . . 0, the chip 506b may be hard-wired to an address 01 . . . 0, and the chip 506n may be hard-wired to an address 11 . . . 1, where VSS represents a voltage level corresponding to the value of 0 and VDD represents a voltage level corresponding to the value of 1. By hard-wiring a unique address for each of the transceiver chips 506a-506n, separate chip select lines are eliminated, which simplifies layout of the phased array antenna panel 504. For example, a conventional phased array antenna panel with 64 transceiver chips would require an interface with 64 individual chip select lines (e.g., SS/CS) routed on the panel circuit board. The hard-wired addressing scheme in accordance with an embodiment of the invention reduces the interface to a single SS/CS line, regardless of the number of transceiver circuits implemented. Instead, the address of a particular transceiver circuit 506a-506n to which a communication is directed is sent to the particular transceiver circuit 506a-506n as part of the SPI communication. An SPI communication containing an address different from the hard-wired address of a transceiver circuit 506a-506n may be ignored.

Figure 7:
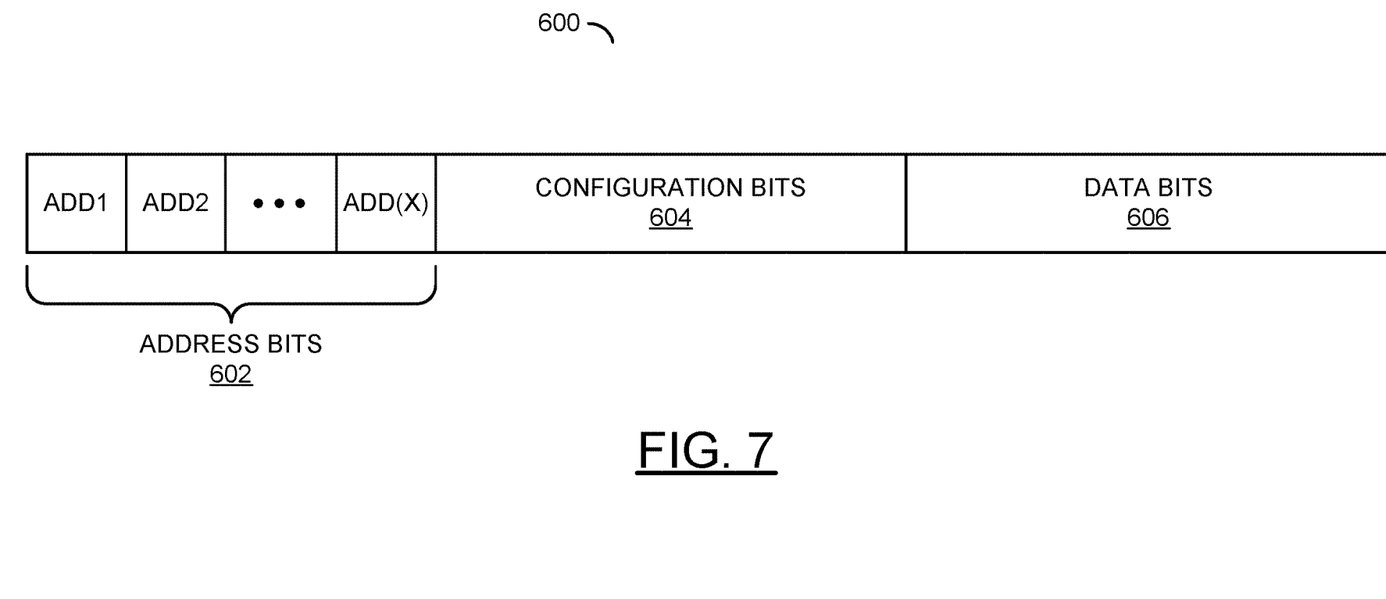
FIG. 7 is a diagram illustrating an example serial interface of a phased array antenna panel in accordance with an example embodiment of the invention.

Referring to FIG. 7, a diagram is shown illustrating an example of a serial interface of a phased array antenna panel in accordance with an example embodiment of the invention. In embodiments implementing a SPI interface, each SPI transaction 600 generally includes an address portion 602, a command/configuration portion 604, and a data portion 606. In various embodiments, the address portion 602 contains the hard-wired address of the transceiver circuit (or chip) to which the transaction is directed, the command/configuration portion 604 specifies an action (e.g., write, read, internal address, mode selections, etc.), and any data bits to be written to the addressed transceiver circuit. In an example, the command/configuration portion 604 may identify an internal address (e.g., a register within the beam former circuit) to be programmed with the data contained in the data portion 606. The number of address bits, configuration bits, and data bits may be varied to meet the design criteria of a particular implementation. The order in which the configuration bits and the data bits are placed may be varied to meet the design criteria of a particular implementation. In an example, a most significant bit (MSB) may come first in time in each portion 604 and 606. In another example, the least significant bit (LSB) may come first in time in each portion 604 and 606.

Figure 8:
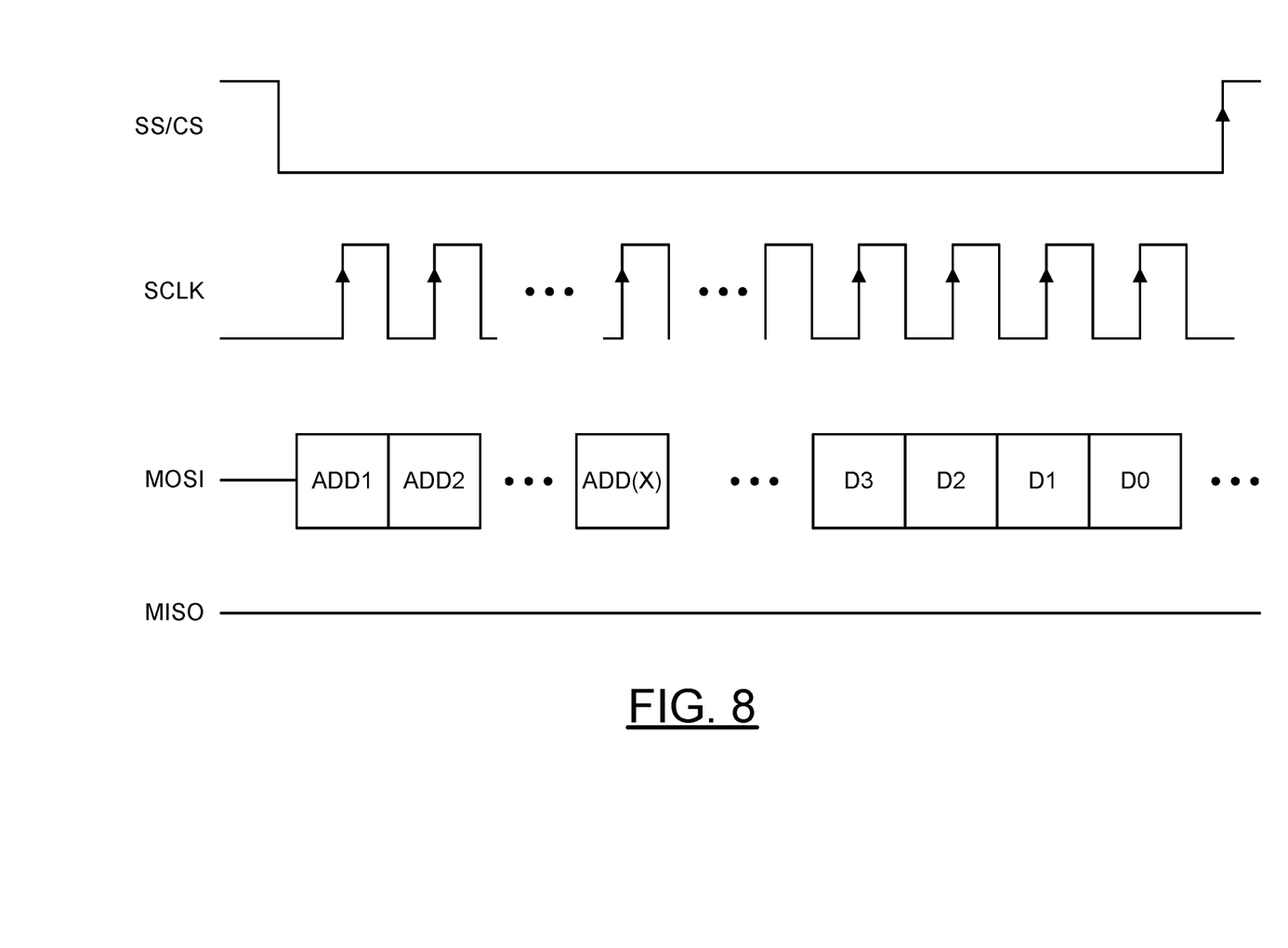
FIG. 8 is a diagram illustrating a write operation to a phased array antenna panel in accordance with an example embodiment of the invention.

Referring to FIG. 8, a diagram is shown illustrating an example of a write operation to a phased array antenna panel in accordance with an example embodiment of the invention. For each write operation, the signal SS/CS may be pulled down (e.g., LOW or a logic 0) and an input sequence may be sent on the MOSI line. The input sequence is generally sent synchronously with the clock signal SCLK. In an example, each bit of the input sequence may be sampled on a rising edge of the clock signal SCLK. At the end of each write operation, the signal SS/CS may be pulled up (e.g., HIGH or a logic 1) to complete the operation. The write operation is performed only if the hard-wired address of the particular beam forming circuit matches the address specified in the input sequence. Otherwise, the beam forming circuit does not start the write operation. During a write operation, the MISO line is generally in a high-Z impedance mode.

Figure 9:
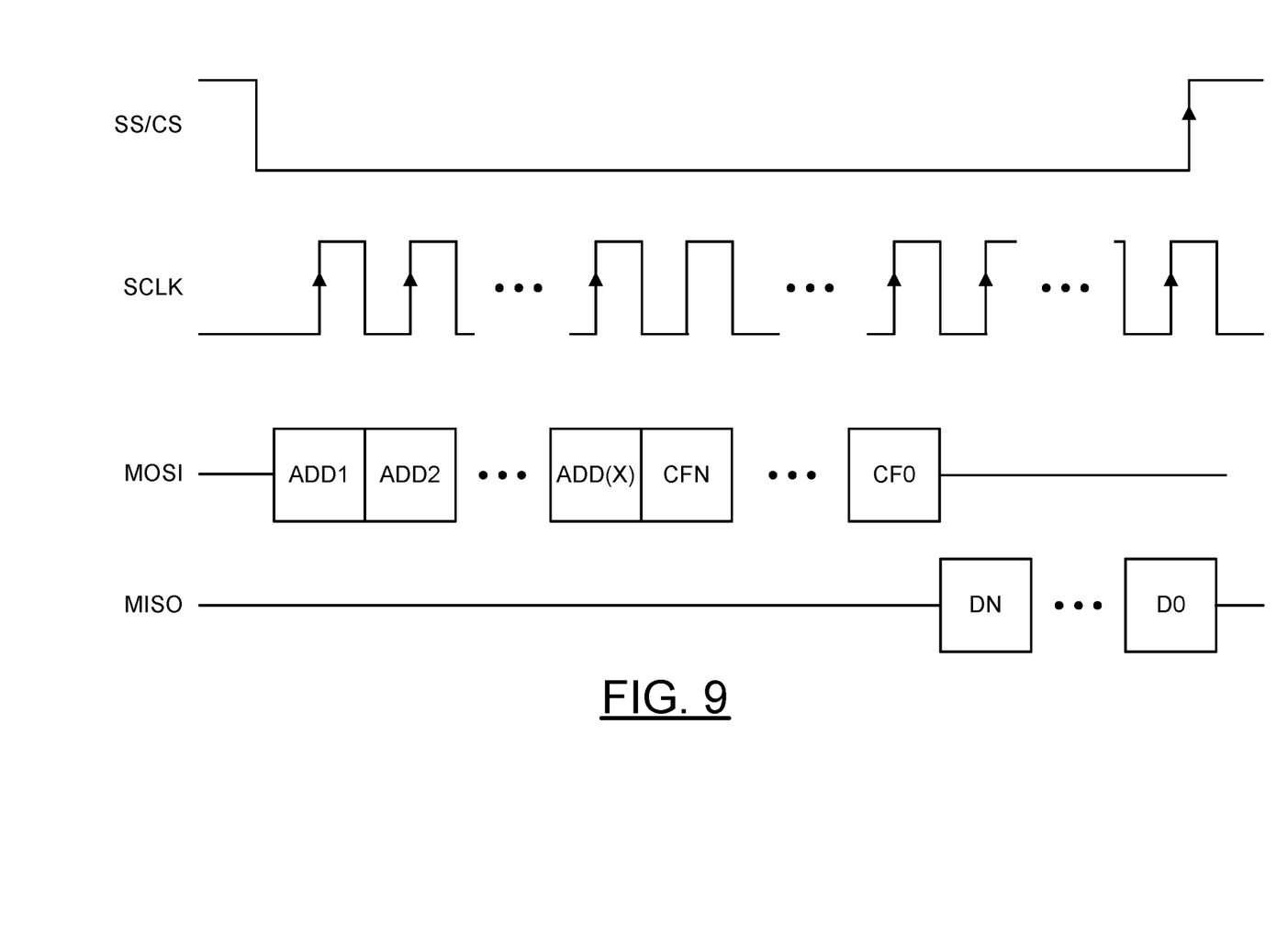
FIG. 9 is a diagram of a read operation of a phased array antenna panel in accordance with an example embodiment of the invention.

Referring to FIG. 9, a diagram is shown illustrating an example of a read operation to a phased array antenna panel in accordance with an example embodiment of the invention. In an example, a read operation may be performed for each set of data bits to be read. For each read operation, the signal SS/CS may be pulled down (e.g., LOW or a logic 0) and an input sequence may be specifying parameters of the particular read operation. The input sequence may be sent synchronously with the clock signal SCLK. In an example, each bit of the input sequence may be sampled on a rising edge of the clock signal SCLK. At the end of each read operation, the signal SS/CS is pulled up (e.g., HIGH or a logic 1) to complete the operation. The read operation is performed only if the hard-wired address of the particular beam forming circuit matches the address specified in the input sequence. Otherwise, the particular beam forming circuit does not start the read operation. During a read operation, the MISO line is active. In the data portion 606 of the operation 600, the particular beam forming circuit addressed communicates the expected data values requested by the configuration portion 604 on the MISO line. During the read operation, only one of the beam forming circuits (e.g., 112a-112m or 212a-212m) on one panel should be selected. When the read operation is complete, the MISO line returns to the high-Z impedance mode.

Figure 10:
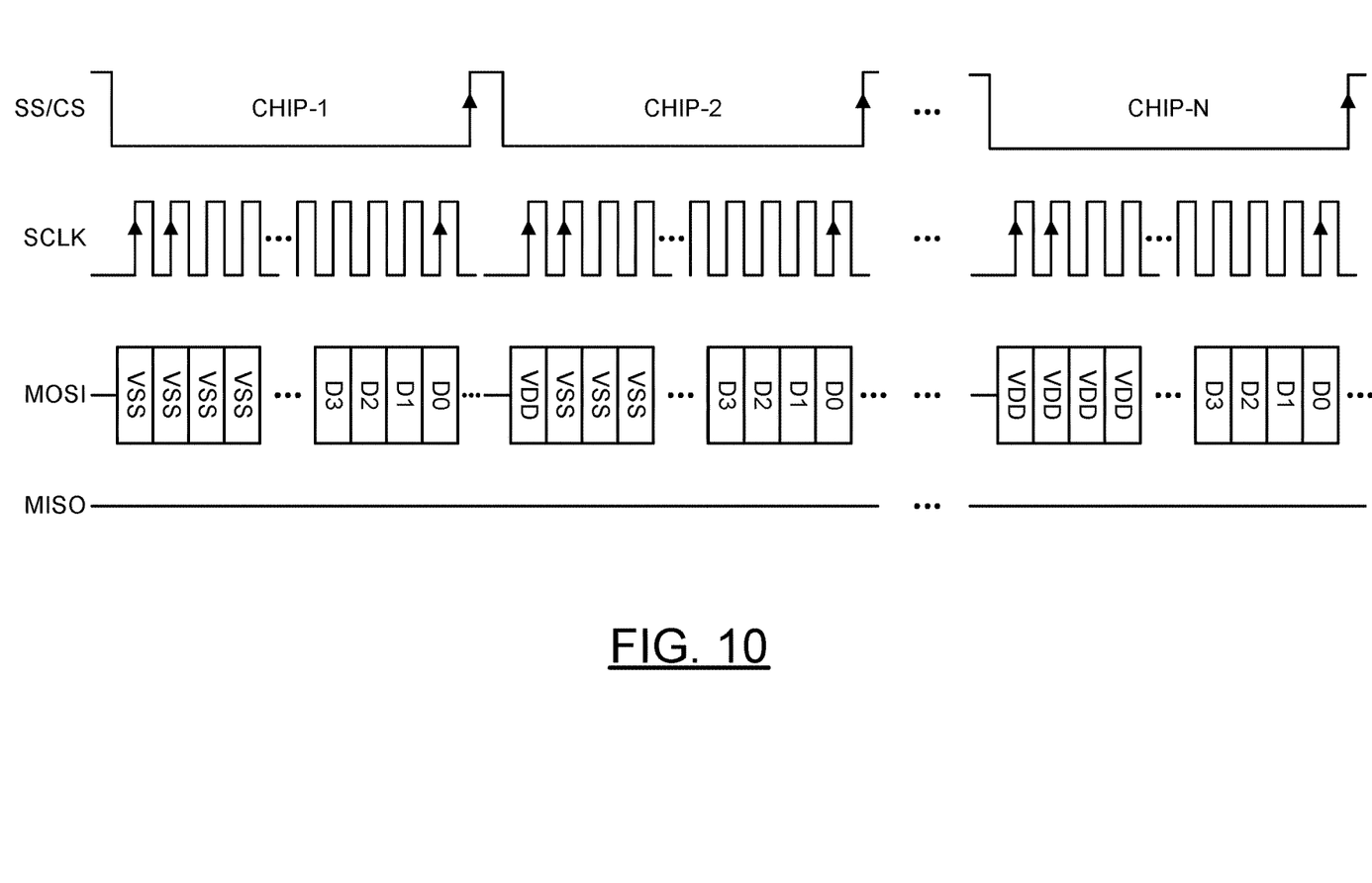
FIG. 10 is a diagram illustrating an example of a communication timing for multiple beam former chips of a phased array antenna panel in accordance with an example embodiment of the invention.

Referring to FIG. 10, a diagram is shown illustrating an example communication timing for writing to multiple beam former circuits on a phased array antenna panel in accordance with an example embodiment of the invention. In an example with N chips, a first chip (e.g., CHIP-1) may be hard-wired to an address 0000, a second chip (e.g., CHIP-2) may be hard-wired to an address 0100, and a third chip (e.g., CHIP-N) may be hard-wired to an address 1111. In an example, a communication sequence to write to the three chips may include input sequences that have address portions containing the addresses for the three chips (e.g., 0000, 0100, and 1111, where VSS represents a voltage level corresponding to the value of 0 and VDD represents a voltage level corresponding to the value of 1).

Although embodiments of the invention have been described in the context of a 5G application, the present invention is not limited to 5G applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G) specifications or future specifications.

The functions and structures illustrated in the diagrams of FIGS. 1 to 10 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The various signals described above are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet design criteria of a particular implementation.

The use of letters (e.g., 112a-112m, ADD1-ADD(X), RF1-RFN, etc.) intended to indicate that any number of the corresponding index may be implemented while staying within the scope of the invention. The letters should not be construed as requiring particular relationships or relative magnitudes between the various labels in which the letters are used. The number of elements specified using letters may be different or similar. In an example, the hard-wired address ADD1-ADD(X) may be implement as bits while the number antenna input/outputs (or transceiver channels) RF1-RFN may be implemented as 4. In another example, the hard-wired address ADD1-ADD(X) may be implemented as six bits while the number antenna input/outputs (or transceiver channels) RF1-RFN may be implemented as eight.

While the invention has been particularly shown and described with reference to embodiments thereof, it will be understood by those skilled in the art that various changes in form and details may be made without departing from the scope of the invention.

The invention claimed is:

1. An apparatus comprising:
   a phased array antenna panel comprising a plurality of antenna elements; and
   a plurality of beam former circuits (i) each mounted on said phased array antenna panel adjacent to a number of said antenna elements, (ii) each having one or more ports directly coupled to each of the adjacent antenna elements, (iii) each configured to generate a plurality of radio-frequency output signals at said ports while in a transmit mode, (iv) each configured to receive a plurality of radio-frequency input signals at said ports while in a receive mode, and (v) each implementing a hard-wired address.

2. The apparatus according to claim 1, wherein said hard-wired address of each of said beam former circuits is set during manufacture of the beam former circuits.

3. The apparatus according to claim 2, wherein said hard-wired address is programmed within an integrated circuit implementing the beam former circuits.

4. The apparatus according to claim 3, wherein said hard-wired address is programmed using fuses within the integrated circuit implementing the beam former circuits.

5. The apparatus according to claim 3, wherein said hard-wired address is programmed using anti-fuses within the integrated circuit implementing the beam former circuits.

6. The apparatus according to claim 1, wherein said hard-wired address is set by tying a number of address pins of each of the beam former circuits to either a supply voltage or a ground potential of the phased array antenna panel.

7. The apparatus according to claim 1, wherein each of said antenna elements comprises either a single-polarization antenna element or a dual-polarization antenna element.

8. The apparatus according to claim 7, wherein said dual-polarization antenna element has a vertical feed and a horizontal feed.

9. The apparatus according to claim 1, wherein each of said beam former circuits comprises a single-polarization beam former circuit or a dual-polarization beam finder circuit.

10. The apparatus according to claim 1, wherein each of said beam former circuits comprises an interface circuit implementing one or more serial communication protocols.

11. The apparatus according to claim 10, wherein said serial communication protocols comprise a serial peripheral interface protocol, an inter-integrated circuit communications protocol, or a daisy chain.

12. The apparatus according to claim 1, wherein said phased array antenna panel is connected to a controller via a serial bus and said controller utilizes said hard-wired address of each of said beam former circuits to program a plurality of phase and gain values into each of said beam former circuits.

13. A method of communicating with a phased array antenna panel comprising:
   setting a plurality of hard-wired addresses for a plurality of beam former circuits mounted on said phased array antenna panel adjacent to a plurality of antenna elements;
   coupling one or more radio frequency input/output ports of each of said beam former circuits to each of the adjacent antenna elements; and coupling each of said plurality of beam former circuits to a controller via a serial bus.

14. The method according to claim 13, wherein each of said beam former circuits comprises an interface circuit implementing one or more serial communication protocols.

15. The method according to claim 14, wherein said serial communication protocols comprise one or more of a serial peripheral interface protocol, an inter-integrated circuit communications protocol, or a daisy chain.

16. The method according to claim 13, wherein said controller utilizes said hard-wired addresses of said beam former circuits to program a plurality of phase and gain values into each of said beam former circuits using said serial bus.

17. The method according to claim 13, further comprising:
generating a plurality of radio-frequency output signals at said ports when operating in a transmit mode; and
receiving a plurality of radio-frequency input signals at said ports when operating in a receive mode.

18. The method according to claim 13, wherein said hard-wired addresses of each of said beam former circuits are set during manufacture of the beam former circuits.

19. The method according to claim 13, wherein said hard-wired addresses are programmed using at least one of fuses and anti-fuses within an integrated circuit implementing the beam former circuits.

20. The method according to claim 13, wherein said hard-wired addresses are set by tying a number of address pins of each of the beam former circuits to either a supply voltage or a ground potential of the phased array antenna panel.

* * * * *